United States Patent [19]

Lockwood

[11] 4,401,487
[45] Aug. 30, 1983

[54] LIQUID PHASE EPITAXY OF MERCURY CADMIUM TELLURIDE LAYER

[75] Inventor: Arthur H. Lockwood, Goleta, Calif.

[73] Assignee: Hughes Aircraft Company, El Segundo, Calif.

[21] Appl. No.: 206,760

[22] Filed: Nov. 14, 1980

[51] Int. Cl.$^3$ ..................................... H01L 21/368
[52] U.S. Cl. ................................ 148/171; 148/172; 156/624; 29/576 E
[58] Field of Search .................. 148/171, 172, 173; 29/576 E, 572; 156/624, 601, 609, DIG. 72, DIG. 82, DIG. 90; 118/666, 667

[56] References Cited

U.S. PATENT DOCUMENTS

| | | | |
|---|---|---|---|
| 3,113,056 | 12/1963 | Van Doorn | 148/171 |
| 3,664,294 | 5/1972 | Solomon | 148/171 X |
| 3,718,511 | 2/1973 | Moulin | 148/171 X |
| 3,723,190 | 3/1973 | Kruse et al. | 148/1.5 |
| 3,725,135 | 4/1973 | Hager et al. | 148/1.5 |
| 3,762,943 | 10/1973 | Winstel et al. | 148/1.5 X |
| 3,805,044 | 4/1974 | Bhattacharyya et al. | 156/601 |
| 3,902,924 | 9/1975 | Maciolek et al. | 148/171 X |
| 4,026,735 | 5/1977 | Kamath et al. | 148/171 X |
| 4,053,334 | 11/1977 | Ehle et al. | 148/172 X |
| 4,086,106 | 4/1978 | Johnson et al. | 148/33 |
| 4,190,486 | 2/1980 | Kyle | 156/601 |
| 4,263,065 | 4/1981 | Wang et al. | 148/172 |
| 4,273,596 | 6/1981 | Gutierrez et al. | 148/171 |
| 4,317,689 | 3/1982 | Bowers et al. | 148/171 |

FOREIGN PATENT DOCUMENTS 2362263 6/1974 Fed. Rep. of Germany ... 156/DIG. 90

OTHER PUBLICATIONS

Joseph L. Schmit and John E. Bowers, "LPE Growth of $Hg_{0.60}$-$CD_{0.40}Te$ from Te-rich Solution", Appl. Phys. Lett. 35(6), Sep. 15, 1979, pp. 457-458.

*Primary Examiner*—G. Ozaki
*Attorney, Agent, or Firm*—Mary E. Lachman; A. W. Karambelas

[57] ABSTRACT

The specification discloses a process and apparatus for forming a layer of mercury cadmium telluride of predetermined composition on the surface of a selected substrate by first providing a crystal growth melt comprising mercury, cadmium, and tellurium in a vertically-oriented crystal growth chamber. The melt comprises 33.33 mole percent or more of mercury and is maintained at a predetermined temperature above the liquidus temperature thereof. A condensing means is provided atop the crystal growth chamber in order to condense vapors of mercury which escape from the melt and to return this condensed mercury to the melt, to thereby maintain the melt at a constant composition. The substrate is contacted with this crystal growth melt for a predetermined period of time while cooling the melt below its liquidus temperature at a predetermined rate sufficient to cause the crystal growth of the layer of mercury cadmium telluride on the substrate to a desired thickness. The layer of mercury cadmium telluride so formed is of uniform composition and of high purity and is formed at a relatively low growth temperature and relatively low system pressure.

7 Claims, 2 Drawing Figures

LIQUID PHASE EPITAXY OF MERCURY CADMIUM TELLURIDE LAYER

BACKGROUND OF THE INVENTION

1. Field of the Invention

This invention relates generally to a process and apparatus for forming a layer of mercury cadmium telluride, and, more particularly, to such a process using liquid phase epitaxial deposition from a mercury-rich melt.

2. Description of the Prior Art

Mercury cadmium telluride is a material which is useful as a photodetector, i.e., a detector that responds to radiant energy. In particular, mercury cadmium telluride (HgCdTe) is very useful in the fabrication of infrared detectors, i.e., devices which, in combination with other suitable signal processing means, are used to determine the presence and/or bearing of an object by sensing infrared radiation from its surfaces. More recently, infrared focal plane array technology has advanced toward single chip structures which incorporate multiple levels of photodetector cells, in which material properties are different on each level. Some multi-layered structures for infrared detection have been demonstrated in compound semiconductors of the elements in the periodic table in Groups IV and VI such as lead tin telluride (PbSnTe), and of Groups III and V such as indium arsenide antimonide (InAsSb), as described respectively, for example, by Schoolar et al in *Infrared Physics*, Vol. 20, No. 4, July 1980, page 271 et seq. and by D. T. Cheung et al in *Applied Physics Letters*, Vol. 30, No. 11, June 1977, page 587 et seq. However, compound semiconductors of Groups II and VI of the periodic table, such as HgCdTe, offer numerous potential advantages for multi-layered detection and signal processing. Such advantages include a wide range of applicability for wavelengths in the range from less than one micrometer to greater than twenty micrometers, a small lattice mismatch between mercury telluride (HgTe) and cadmium telluride (CdTe), low carrier concentrations, low dielectric constant, and low thermal expansion. In order to achieve these advantages, the HgCdTe must be formed as a uniform and highly pure layer and must also be formed in a controlled manner.

Liquid phase epitaxy (LPE) has been used to grow HgCdTe layers, using a process and apparatus as described, for example, by C. C. Wang, S. H. Shin, M. Chu, M. Lanir, and A. H. B. Vanderwyck, in the publication entitled "Liquid Phase Growth of HgCdTe Epitaxial Layers," In the *Journal of the Electrochemical Society: SOLID-STATE SCIENCE AND TECHNOLOGY*, January 1980, Vol. 127, No. 1, pages 175-178. By the process of Wang et al, a CdTe substrate is exposed to a tellurium solution containing predetermined amounts of mercury and cadmium, with the solution being maintained at a predetermined temperature above its liquidus temperature. Then, the solution is cooled below its saturation equilibrium temperature to cause the epitaxial crystal growth on the substrate. One major disadvantage of a process such as Wang's is that a high pressure system must be used in order to control the high mercury vapor pressure which occurs at the relatively high growth temperatures (e.g., 500° C. or higher) required to maintain the crystal growth solution in a molten form.

A similar liquid phase epitaxial process for growing HgCdTe is disclosed in U.S. Pat. No. 3,902,924 to R. B. Maciolek et al, in which there is formed a nearly saturated liquid solution of mercury, cadmium, and tellurium which has a liquidus temperature that is substantially identical to the solids temperature of the desired (Hg,Cd)Te composition. The liquid solution is brought in contact with the substrate and the solution is cooled to produce supersaturation which results in the growth of a thin layer or film of (Hg,Cd)Te on the substrate. The process of Maciolek et al also has the disadvantage that high mercury pressures result from the relatively high growth temperatures (i.e., 800° C. or higher) which are used. Since the mercury is constantly vaporizing from the melt, the composition of the crystal growth melt is constantly changing, and thus the epitaxial layer grown from this changing melt does not have a uniform composition.

Additional complications which arise from the high growth temperatures used in these prior art processes described above include a lack of clearly defined interface between multiple layers and between the substrate and the adjacent deposited layer due to diffusion effects, and an inability to adequately control the carrier concentration of the layers as grown.

It is the alleviation of these prior art problems concerning the formation of a uniform, high purity layer of HgCdTe and concerning the adverse affects caused by high crystal growth temperatures, to which the present invention is directed.

SUMMARY OF THE INVENTION

The general purpose of this invention is to provide a new and improved process and apparatus for forming a layer of mercury cadmium telluride of predetermined composition which possesses most, if not all, of the advantages of the prior art processes and apparatus for forming mercury cadmium telluride layers, while alleviating their significant disadvantages discussed above.

In order to accomplish such purpose, I have discovered and developed a new and improved process for forming a layer of mercury cadmium telluride of predetermined composition on the surface of a selected substrate by first providing a crystal growth melt comprising mercury, cadmium, and tellurium in a vertically-oriented crystal growth chamber. The melt comprises 33.33 mole percent or more of mercury and is maintained at a predetermined temperature above the liquidus temperature thereof. A condensing means is provided atop or vertically adjacent to the crystal growth chamber in order to condense vapors of mercury which escape from the melt and to return this condensed mercury to the melt, to thereby maintain the melt at a constant composition. The substrate is contacted with this crystal growth melt for a predetermined period of time while cooling the melt below its liquidus temperature at a predetermined rate sufficient to cause crystal growth of the layer of mercury cadmium telluride on the substrate to a desired thickness. The layer of mercury cadmium telluride so formed is of uniform composition and of high purity and is formed at a relatively low growth temperature and relatively low system pressure.

Accordingly, it is a purpose of the present invention to provide a new and improved process for forming a layer of mercury cadmium telluride by liquid phase epitaxial growth from a mercury-rich melt.

Another purpose is to provide a process of the type described in which the mercury cadmium telluride layer is of high purity by virtue of the high purity of the mercury melt growth solution.

A further purpose is to provide a process of the type described in which the mercury cadmium telluride layer formed is of uniform composition.

Still another purpose is to provide a process of the type described in which a relatively low growth temperature is used to thereby enable control over diffusion effects and carrier concentration in the layer so grown and to enable reduced mercury vapor pressure in the crystal growth system.

Yet another purpose of the present invention is to provide a process of the type described in which volatile mercury is maintained within the growth system to thereby maintain the growth solution at a constant composition and thus grow uniform and reproducible layers of mercury cadmium telluride.

Another purpose is to provide a process of the type described in which a relatively low pressure (i.e., one atmosphere) is used.

Still another purpose of the present invention is to provide a vertical liquid phase epitaxial growth apparatus which includes a means for condensing vaporized mercury and returning it to the growth melt.

A feature of the apparatus of the present invention is that a reflux area is provided atop the crystal growth chamber in order to condense volatilized mercury escaping from the crystal growth melt and return it to the melt.

Another feature of the apparatus of the present invention is that a closed loop temperature control system using a digital computer and multiple heating zones under independent control is used.

These and other advantages and features of the present invention will become more readily apparent in the following description of the drawings and the preferred embodiment of the invention.

DETAILED DESCRIPTION OF THE INVENTION

Figure 1:
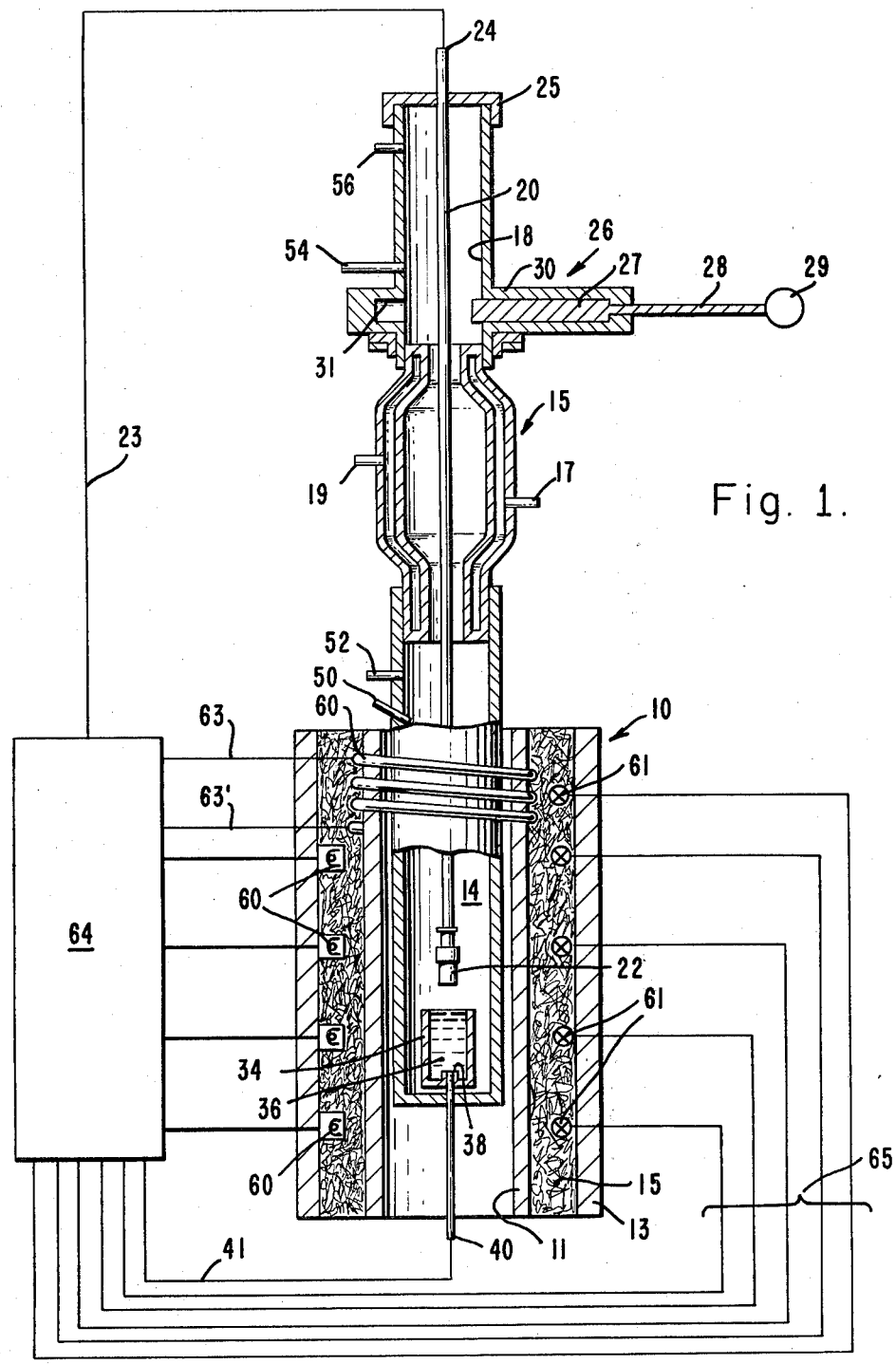
FIG. 1 illustrates, in schematic form, one suitable apparatus for carrying out the process of the present invention.

FIG. 1 shows, in schematic form, a vertical liquid phase epitaxial crystal growth apparatus for carrying out the process of the present invention. This apparatus is of the general type used to grow epitaxial layers of gallium arsenide as described in U.S. Pat. No. 4,026,735 to G. S. Kamath and H. P. Mitchell, assigned to the present assignee, and incorporated herein by reference, with the modifications as discussed in detail below. As shown in FIG. 1, there is provided a conventional liquid phase epitaxy furnace member 10 having a central opening therein (not visible in FIG. 1) for receiving an elongated hollow liquid phase epitaxy crystal growth housing 14. The furnace member 10 has inner walls 11 and outer walls 13 with thermal insulation 15 placed between each inner wall 11 and its opposing outer wall 13.

On the lower horizontal surface of the crystal growth housing 14, there is mounted by conventional means (not shown) a standard crucible 34, which contains the crystal growth melt 36. The crystal growth melt 36 comprises predominantly Hg (i.e., greater than 33.33 mole percent of Hg) and the composition of the melt 36 is predetermined to provide the desired composition of the mercury cadmium telluride layer to be formed. Using the formula $Hg_{1-x}Cd_xTe$ to represent the composition of the mercury cadmium telluride, x may equal any value in the range of zero to one for the layer deposited by the process of the present invention.

The crucible 34 includes a recessed portion 38 in the bottom surface thereof for receiving a thermocouple device 40 which detects the temperature of the melt 36 and provides an input via a signal line or conductor 41 to a computerized closed loop temperature control means 64 which is used to accurately control the temperature of the melt 36, as discussed in more detail below.

At the upper end of the crystal growth housing 14 there is provided an inlet tube 50 through which hydrogen gas ($H_2$) is introduced into the crystal growth housing 14 in order to maintain a purified $H_2$ atmosphere before and during the crystal growth process. Also at the upper end of the crystal growth housing 14 there is provided an outlet tube 52 through which the $H_2$ may exit.

Located vertically above or atop the crystal growth housing 14 and external to the furnace member 10, there is a reflux means 15 which comprises a double walled quartz tube between the walls of which water or gas is circulated in order to cool and condense hot mercury vapors which escape from the crystal growth melt into the reflux means 15 and return the condensed mercury back to the melt, to thereby maintain a uniform melt composition. Water or gas enters the reflux means 15 through the inlet tube 17 and exits through the outlet tube 19.

A high vacuum valve member, designated generally 26, interfaces on one horizontal surface with the upper surface of the reflux means 15 and on the opposite horizontal surface with a transfer chamber 18 to be discussed below. This high vacuum valve member 26 comprises a main valve diaphram member 27 formed integrally with a push rod 28 and a handle 29 which are used to move the diaphram member 27 horizontally within the valve case 30, and a left-hand chamber portion 31 of the valve case 30. This valve member 26 functions as described in U.S. Pat. No. 4,026,735 (previously referenced herein) in relation to FIG. 1 therein, and incorporated herein by reference.

The transfer chamber 18, which is located vertically above or a top the valve member 26, comprises a hollow chamber for receiving a vertical dipping rod or tube 20 and the wafer holder 22 which is attached to the lower end of the rod 20. The wafer holder 22 may optionally be of the type having a sliding cover, and described in U.S. Pat. No. 4,026,735, previously referenced herein. A thermocouple means (not shown) is positioned adjacent to one major surface of a wafer (not shown) in the wafer holder 22 in order to sense the temperature of the wafer. The thermocouple wire runs through the center of the tube 20 and exits through the upper end 24 thereof. The thermocouple wire is then connected via a signal line 23 to the computer means 64, whereby data on the temperature of the wafer is input to the computer 64.

The rod 20 is moved at its upper end 24 in order to transfer the wafer holder 22 and the wafer attached thereto from the transfer chamber 18 into position within the furnace 10 as shown in FIG. 1. The transfer chamber 18 is provided at its upper horizontal surface with a removable cover 25 which includes a central opening for receiving the vertical dipping rod 20. The transfer chamber 18 is also provided with a gas inlet means 54 and a gas outlet means 56 by which hydrogen is respectively introduced into and removed from the transfer chamber 18 when the valve member 26 is in its closed position and in initial preparation for the crystal growth process.

The furnace member 10 is heated by passing a controlled current through five separately wound heating elements 60 which surround the inner walls 11 of the furnace member 10 in five heating zones. Each separate winding 60 has a corresponding thermocouple device 61 located in close proximity thereto for detecting the temperature thereof. Each thermocouple device 61 is, in turn, connected via a signal line or conductor 65 to a digital computer means 64 which contains standard digital control circuitry and which provides closed loop temperature control functions as described, for example, by Cecil L. Smith in the book entitled "Digital Computer Process Control," Intext Educational Publications, New York (1972). An electrical signal corresponding to the temperature sensed by the thermocouple device 61 is input to the computer 64 via the signal line 65. In addition, the computer 64 receives an input signal via signal line 41 from the thermocouple means 40 which detects the temperature of the melt 36 as discussed above. The computer 64 also receives an input signal via signal line 23 from the thermocouple means (not shown) that is located behind the wafer, as previously discussed herein. Using a proportional integral derivative (P-I-D) control algorithm, the computer 64 compares the value of the temperature of the melt 36 detected by the thermocouple means 40 with a predetermined value and provides the appropriate separate signal to each of the five separate heating elements 60 via a corresponding signal line or conductor 63 to produce the required furnace temperature to bring the melt 36 to the desired temperature. Each winding 60 is connected to ground within the computer means 64 via a conductor 63'. Using this closed loop temperature control system just described, the temperature of the melt 36 may be accurately controlled within the range of 0.01° to 0.1° C. Optionally, a Z-transfer control algorithm may be used to provide even higher accuracy in temperature control.

This accurate control of the temperature of the melt enables separation of the bunched tie lines to the $Hg_{1-x}Cd_xTe$ solidus phase which occur in the liquidus isotherms in the Hg corner of the Hg-Cd-Te phase diagram (Gibbs triangle), and consequently enables accurate control of the composition of the solid layer deposited. In addition, such a system provides the capability of dynamically changing the temperature of the system as desired and provides flexibility in profiling the system to provide, for example, a desirable slightly lower temperature above the melt than elsewhere in the crystal growth housing.

In practicing the process of the present invention using the apparatus described in FIG. 1, a mercury-rich melt of predetermined composition is placed in a standard crucible, which is placed within the crystal growth housing 14 in the multi-zoned furnace 10. The multi-zone furnace 10 is heated by passing a controlled current through five separately wound heating elements 60 under direction and control of the computer 64 as discussed above. The temperature within the furnace 10 is carefully controlled and maintained at the predetermined temperature above the liquidus teperature of the crystal growth melt using the computer control system as described previously. A coolant, such as water, is circulated through the reflux means 15 via the inlet 17 and the outlet 19.

With the valve member 26 in the closed position, the transfer chamber 18 is purified by continuously passing hydrogen therethrough via the inlet 54 and the outlet 56; and the crystal growth housing 14 is purified by continuously passing hydrogen therethrough via the inlet 50 and the outlet 52. Next, with the valve member 26 still in the closed position, the cover 25 is removed and the vertical dipping rod 20 and the wafer holder 22 with a wafer, such as a CdTe substrate, are inserted into the transfer chamber 18. The cover 25 is replaced. The transfer chamber 18 is again purified by a series of evacuation and hydrogen-pure operations and ending with a hydrogen purge. Then the valve 26 is opened so that the wafer holder 22 may be lowered into the crystal growth housing 14. Hydrogen is passed continuously through the crystal growth housing 14 during the entire crystal growth process described herein.

When the temperature of the crystal growth melt within the furnace 10 has been stabilized to the desired temperature, the wafer holder 22 and the wafer are lowered into the crystal growth melt by pushing down on the upper portion 24 of the rod 20. The wafer is contacted with the crystal growth melt 36 for a predetermined period of time while cooling the melt below the liquidus temperature thereof at a predetermined rate sufficient to cause crystal growth of a layer of mercury cadmium telluride on the wafer. Cooling of the crystal growth melt 36 is achieved by proper control of the current provided to the heating elements 60, with reduced current input providing reduced heating (i.e., cooling) of the melt 36. When the layer of mercury cadmium telluride has been deposited to the desired thickness, the wafer holder 22 and the wafer are removed from the crystal growth melt 36 by pulling up the upper end 24 of the rod 20, and the crystal growth process is concluded.

By the process of the present invention, the crystal growth melt for the formation of a layer of mercury cadmium telluride comprises predominantly (i.e., greater than 33.33 mole percent) mercury. By using such a mercury-rich solution, the crystal growth can be performed at a temperature of less than 390° C., which partially alleviates the prior art problem of high mercury partial pressures encountered at the relatively high growth temperatures (i.e., greater than 600° C.) used in some prior art processes. In addition, the use of a lower growth temperature enables minimization of diffusion effects between grown layers and between the substrate and the adjacent grown layer, to thereby form clearly defined interfaces between these layers. Further, the use of a low growth temperature enables greater control over the carrier concentration of the layers as grown.

In addition, by using a crystal growth melt comprising predominantly mercury, the effects of impurities are minimized since mercury is available commercially in extremely high purities, namely having impurities of less than 100 parts per billion.

Furthermore, by the process of the present invention, the crystal growth melt is maintained at a constant composition which enables the formation of uniform and reproducible layers of mercury cadmium telluride. This constant composition is achieved by maintaining the volatile mercury within the crystal growth system by use of a reflux area or other condensing means for condensing the mercury vapor and returning the condensed mercury to the crystal growth solution. In addition, due to the reduced mercury vapor pressures achieved by the process of the present invention, the crystal growth process may be conducted at a convenient one atmosphere, rather than under high pressure as required by the prior art processes discussed herein.

Finally, by the process of the present invention, the mercury cadmium telluride layers formed exhibit the desired n-type conduction as grown and do not require a post-crystal growth heat treatment procedure to convert the p-type layer as grown to n-type as do the layers grown by the prior art processes discussed herein. In addition, the epitaxial layers formed by the process of the present invention reflect the freedom from low angle grain boundaries which is characteristic of the CdTe substrates.

Figure 2:
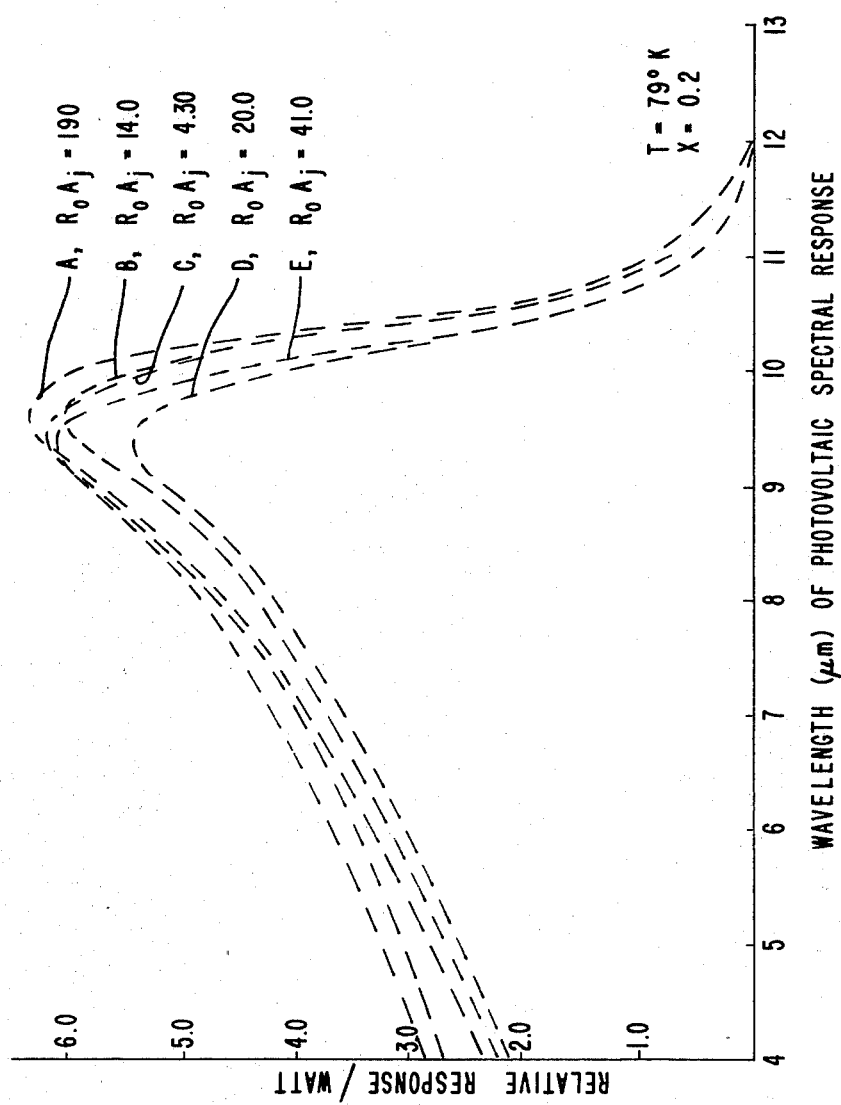
FIG. 2 presents a set of curves showing the spectral response and the value of the resistance-area product ($R_oA_j$) of photodiodes having HgCdTe layers deposited in accordance with the process of the present invention.

FIG. 2 presents a set of curves showing the spectral response and the value of the resistance-area product ($R_oA_j$) at the junction of photodiodes fabricated on an epitaxial layer of $Hg_{0.8}Cd_{0.2}Te$ deposited in accordance with the process of the present invention. Each of the curves labelled "A" through "E" in FIG. 2 represents a separate photodiode on the same layer of HgCdTe. The relative response of the photodiode per watt of energy impinging on the photodiode is plotted versus the wavelength of the photovoltaic spectral response in micrometers ($\mu m$). The temperature at which the measurements were made was 79° K.

As can be seen from FIG. 2, spectral uniformity is achieved in HgCdTe layers deposited in accordance with the process of the present invention. In particular, the high degree of compositional uniformity of the epitaxial HgCdTe layers achieved by the process of the present invention is indicated by the close proximity of the cut-off points (the point at which the photodiode response is one-half its maximum value) for the various curves. (These values are within 0.5 micrometers of each other.) In addition, as shown in FIG. 2, relatively high values of $R_oA_j$, which are desirable, can be achieved by forming layers of HgCdTe in accordance with the process of the present invention.

EXAMPLE

In practicing the process of the present invention, using the apparatus described in FIG. 1, a layer of HgCdTe was grown on a one inch wafer of CdTe having a (111) B orientation. The crystal growth melt comprised approximately 90 mole percent mercury saturated with tellurium, and, more particularly, mercury saturated with approximately 0.1 mole percent CdTe and less than 5 mole percent Te. (The CdTe is used to prevent the association of Cd and Te which would normally occur upon mixing together.) Water was circulated through the double walled quartz tube 14. The crystal growth process was conducted at a temperature of approximately 390° C. for a period of approximately one hour to form a layer of mercury cadmium telluride from 2 to 20 micrometers thick. The composition of the layers so formed was $Hg_{1-x}Cd_xTe$ where $x=1.0, 0.5, 0.3,$ or $0.2$.

More particularly, the substrate was placed in a region of the furnace above the melt where the temperature was less than 0.5° C. cooler than in the melt. The melt was cooled from a temperature above its saturation point. At the moment that the melt cooled to its saturation point, the substrate was lowered into the melt. The effect of the cooler substrate entering the melt at the melt saturation point was to instantaneously supersaturate the melt at the substrate surface. This supersaturation produced an extremely high nucleation density that led to good control of the layer morphology.

By using the process just described, layers having the composition $Hg_{1-x}Cd_xTe$ with $x=1, 0.5, 0.3,$ or $0.2$ have been grown by appropriate selection of the melt composition and the growth temperature. In addition, it has been found that by using a CdTe substrate oriented along the "B" (Te-rich) face of the (111) orientation, highly specular layers can be achieved. Measurements of a mercury cadmium telluride layer having the composition $Hg_{0.7}Cd_{0.3}Te$, formed by the process of the present invention indicate a carrier concentration (n-type) of approximately $5 \times 10^{14} cm^{-3}$. The values of the resistance-area product ($R_oA_j$) and the spectral response for $Hg_{0.8}Cd_{0.2}Te$ layers formed by the process of the present invention and subsequently formed into photodiodes is presented in FIG. 2.

The process of the present invention is useful in forming mercury cadmium telluride layers in such devices as simple heterojunction devices, two-color detectors, and multilayered infrared charge-coupled devices used in monolithic focal plane arrays.

While the present invention has been particularly described with respect to the preferred embodiments thereof, it will be recognized by those skilled in the art that certain other modifications in form and detail may be made without departing from the spirit and scope of the invention. In particular, the scope of this invention is not limited to the particular crystal growth melt composition described herein, but is intended to include any crystal growth melt composition comprising one or more components which vaporize and escape from the crystal growth melt. In addition, the present invention is not limited to the particular crystal growth apparatus described herein, but is intended to include any vertical liquid phase epitaxial growth apparatus which incorporates a means for condensing vaporized components of the crystal growth melt and returning them to the crystal growth melt. Further, the means for condensing the mercury vapor is not limited to the reflux column described herein but may include other known means for condensing vapors. In addition, the present invention is not limited to the use of a cadmium telluride substrate, but includes the use of any substrate on which it is desired to deposit a layer of mercury cadmium telluride, including, for example, cadmium selenide telluride ($CdSe_yTe_{1-y}$). Finally, the present invention is not limited to the particular details of the crystal growth process described herein, but is intended to include any crystal growth process details as may be required in order to form a mercury cadmium telluride layer of the desired composition.

What is claimed is:

1. A process for forming a layer of mercury cadmium telluride of a predetermined composition on the surface of a selected substrate at atmospheric pressure which comprises the steps of:
    (a) providing a crystal growth melt comprising mercury, cadmium, and tellurium in a vertically-oriented crystal growth chamber, said melt comprising 33.33 mole percent or more of mercury and said melt being maintained at a predetermined temperature above the liquidus temperature thereof;

(b) providing a condensing means vertically adjacent said crystal growth chamber to condense vapors of said mercury which vaporize from said melt and to return said condensed mercury to said melt, to thereby maintain said melt at a constant composition; and (c) contacting said substrate with said crystal growth melt for a predetermined period of time while cooling said melt below said liquidus temperature to a temperature below 390° C. at a predetermined rate sufficient to cause the crystal growth of said layer of said mercury cadmium telluride on said substrate to a predetermined thickness whereby said layer of said mercury cadmium telluride is of uniform composition and of high purity.

2. The process set forth in claim 1 wherein said mercury cadmium telluride comprises $Hg_{1-xL}Cd_xTe$, where x may equal any value in the range of zero to one.

3. The process set forth in claim 1 wherein said melt comprises approximately 90 mole percent of mercury.

4. The process set forth in claim 1 wherein said substrate is selected from the group consisting of cadmium telluride (CdTe) and cadmium selenide telluride ($CdSe_yTe_{1-y}$).

5. The process set forth in claim 1 wherein said condensing means comprises a reflux column.

6. The process set forth in claim 1 wherein said predetermined thickness of said layer of said mercury cadmium telluride is in the range of 2 to 20 micrometers.

7. The process set forth in claim 1 wherein the temperature of said melt is accurately controlled by a closed loop temperature control system comprising a digital computer means and multiple, independently controlled heating means for applying heat to said crystal growth chamber.

* * * * *

UNITED STATES PATENT AND TRADEMARK OFFICE
CERTIFICATE OF CORRECTION

PATENT NO. : 4,401,487
DATED : August 30, 1983
INVENTOR(S) : Arthur H. Lockwood

It is certified that error appears in the above-identified patent and that said Letters Patent are hereby corrected as shown below:

Page 1, assignee

Delete "Hughes Aircraft Company" and insert therefor --Santa Barbara Research Center--.

Signed and Sealed this

Seventeenth Day of April 1984

[SEAL]

Attest:

GERALD J. MOSSINGHOFF

Attesting Officer     Commissioner of Patents and Trademarks